United States Patent
Cheng et al.

(10) Patent No.: US 10,741,456 B2
(45) Date of Patent: Aug. 11, 2020

(54) VERTICALLY STACKED NANOSHEET CMOS TRANSISTOR

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Zhenxing Bi, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/156,391

(22) Filed: Oct. 10, 2018

(65) Prior Publication Data
US 2020/0118891 A1 Apr. 16, 2020

(51) Int. Cl.
*H01L 29/66* (2006.01)
*H01L 21/84* (2006.01)
*H01L 27/12* (2006.01)
*H01L 29/423* (2006.01)
*H01L 29/06* (2006.01)
*H01L 29/78* (2006.01)

(52) U.S. Cl.
CPC ........ *H01L 21/845* (2013.01); *H01L 27/1211* (2013.01); *H01L 29/66795* (2013.01); *H01L 29/0673* (2013.01); *H01L 29/42392* (2013.01); *H01L 29/7853* (2013.01)

(58) Field of Classification Search
None
See application file for complete search history.

(56) References Cited

U.S. PATENT DOCUMENTS

| | | | |
|---|---|---|---|
| 6,518,112 B2 | 2/2003 | Armacost et al. | |
| 8,216,902 B2 | 7/2012 | Chang et al. | |
| 9,490,323 B2 | 11/2016 | Rodder et al. | |
| 9,837,414 B1* | 12/2017 | Balakrishnan | H01L 29/1083 |
| 9,842,932 B1 | 12/2017 | Chen et al. | |
| 9,991,261 B2 | 6/2018 | Mitard | |
| 10,263,100 B1* | 4/2019 | Bi | H01L 29/785 |
| 2017/0213888 A1* | 7/2017 | Chang | H01L 29/0649 |
| 2018/0047832 A1 | 2/2018 | Tapily et al. | |
| 2018/0083113 A1* | 3/2018 | Balakrishnan | H01L 27/088 |
| 2018/0226490 A1* | 8/2018 | Le | B82Y 10/00 |
| 2018/0277628 A1* | 9/2018 | Bi | H01L 29/0684 |

(Continued)

OTHER PUBLICATIONS

List of IBM Patents or Patent Applications Treated as Related; Date Filed: Nov. 26, 2019, 2 pages.

*Primary Examiner* — Grant S Withers
(74) *Attorney, Agent, or Firm* — Cantor Colburn LLP; Vazken Alexanian

(57) ABSTRACT

Embodiments of the present invention are directed to techniques for generating vertically stacked nanosheet CMOS (Complementary Metal Oxide Semiconductor) transistor architectures. In a non-limiting embodiment of the invention, a first rare earth oxide layer is formed over a substrate. An n-FET nanosheet stack is formed on the rare earth oxide layer. The n-FET nanosheet stack includes a first nanosheet. A second rare earth oxide layer is formed on the n-FET nanosheet stack. A p-FET nanosheet stack is formed on the second rare earth oxide layer. The p-FET nanosheet stack includes a second nanosheet.

15 Claims, 9 Drawing Sheets

(56) References Cited

U.S. PATENT DOCUMENTS

2019/0035888 A1* 1/2019 Wu .................... H01L 21/02603
2019/0237360 A1* 8/2019 Reznicek ............ H01L 29/6653
2019/0319119 A1* 10/2019 Li ..................... H01L 29/42392
2019/0326395 A1* 10/2019 Ando ................ H01L 29/42392

* cited by examiner

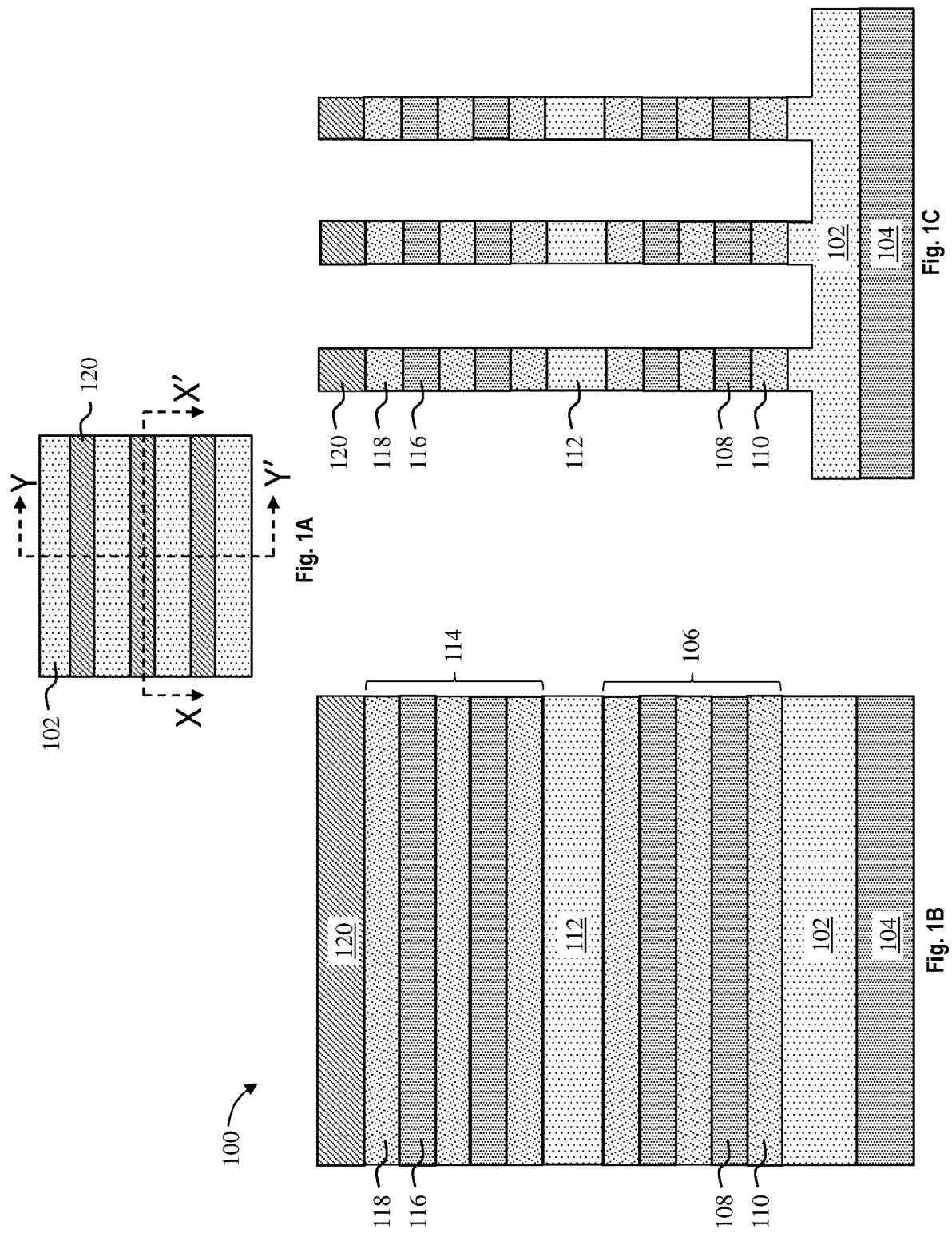

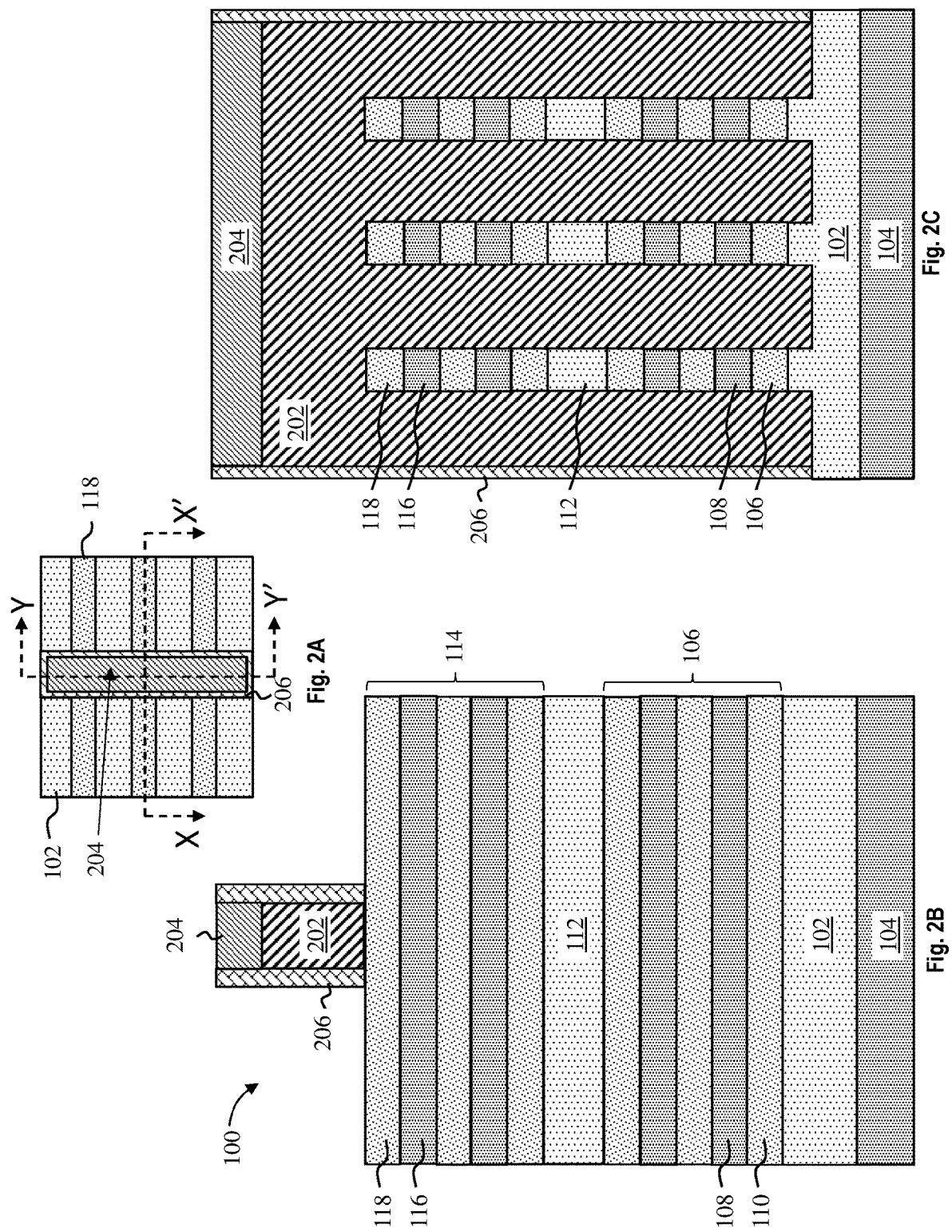

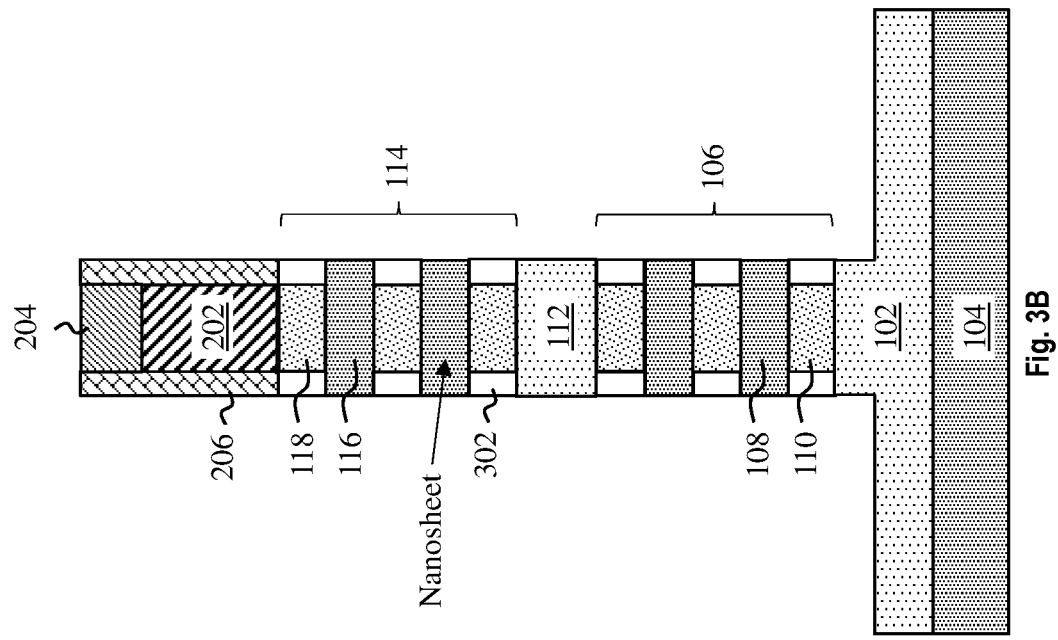
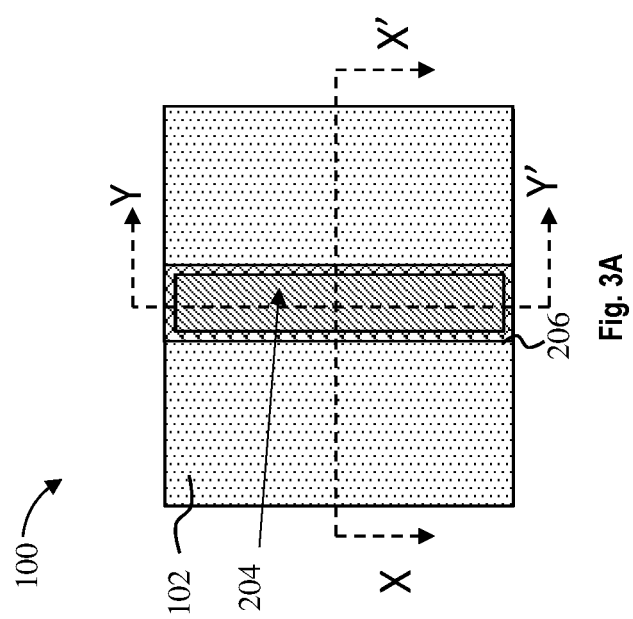
Fig. 3A
Fig. 3B

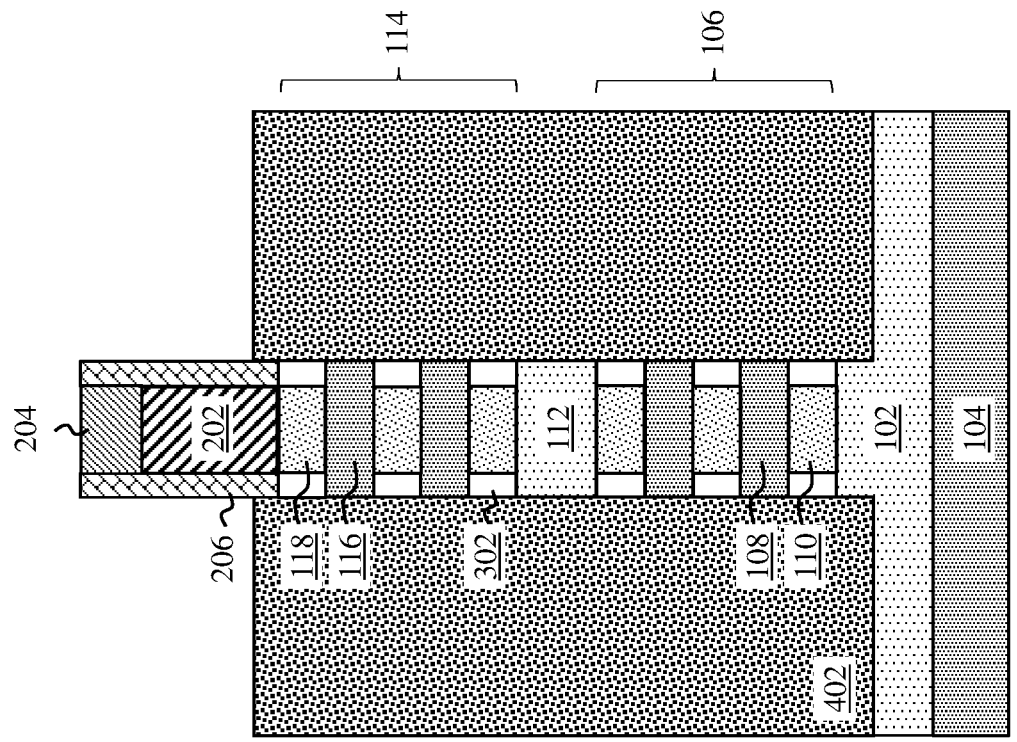
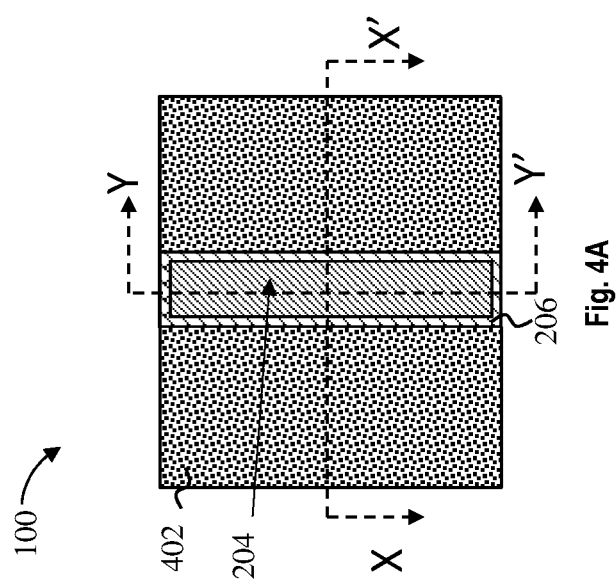
Fig. 4A
Fig. 4B

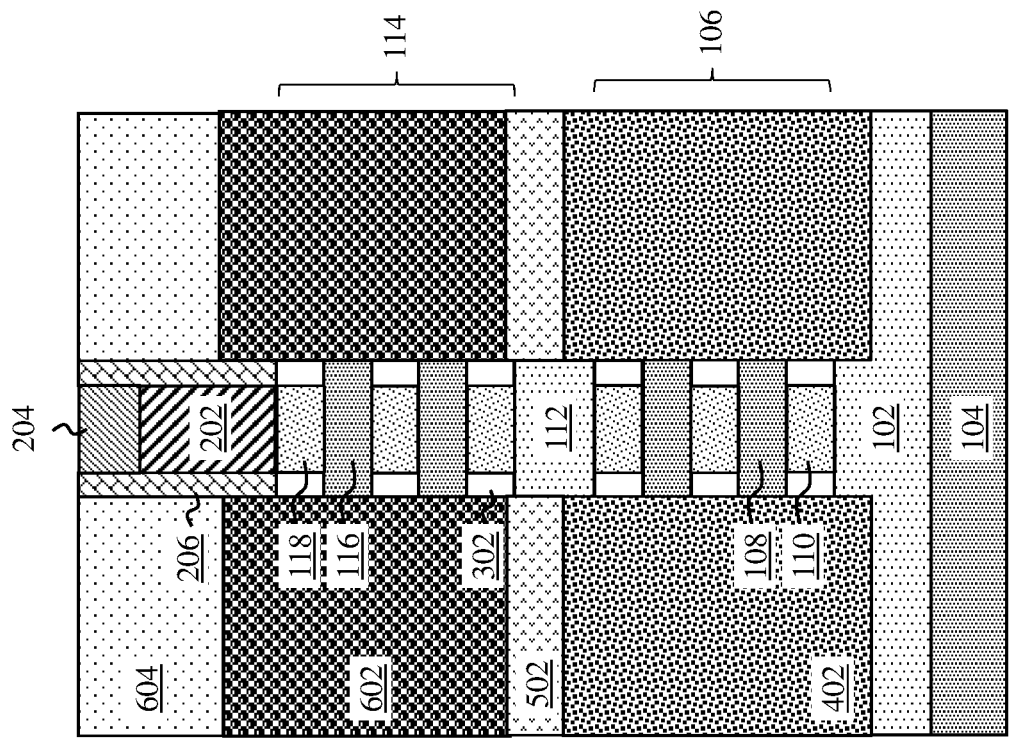
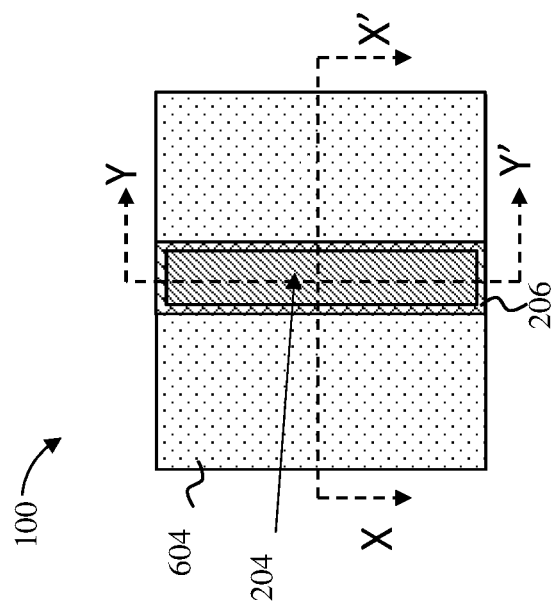
Fig. 6B
Fig. 6A

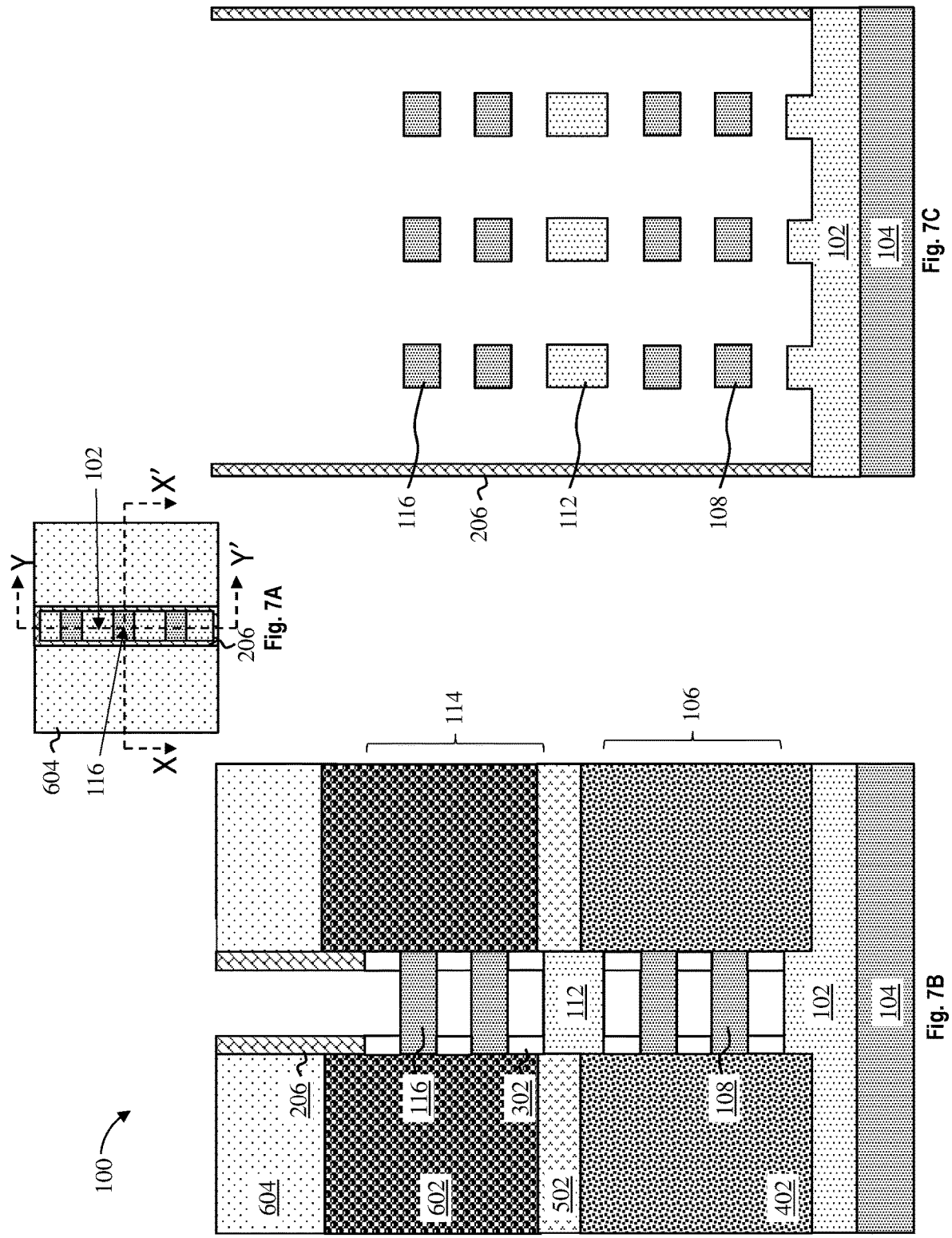

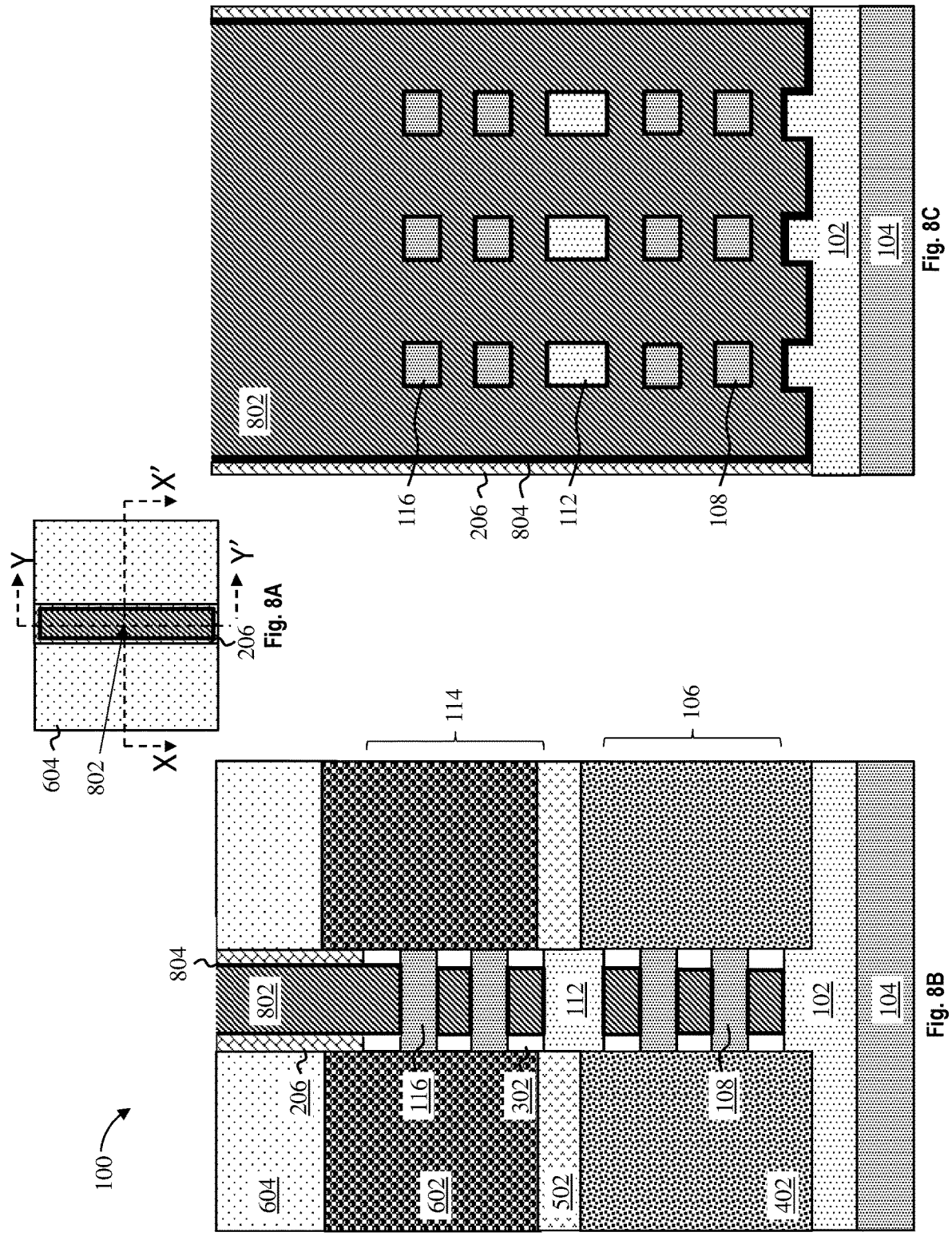

VERTICALLY STACKED NANOSHEET CMOS TRANSISTOR

BACKGROUND

The present invention generally relates to fabrication methods and resulting structures for semiconductor devices, and more specifically, to fabrication methods and resulting structures for a vertically stacked nanosheet CMOS (Complementary Metal Oxide Semiconductor) transistor architecture.

Traditional CMOS fabrication techniques include process flows for constructing planar transistors. With planar transistors, transistor density can be increased by decreasing the pitch between transistor gate elements. The ability to decrease the gate pitch for planar transistors is limited, however, by the required gate length and spacer thickness. In recent years, research has been devoted to the development of nonplanar transistor architectures. Some non-planar transistor architectures, such as vertical field effect transistors (VFETs) and nanosheet field effect transistors (NSFETs), employ semiconductor channels with various gate-all-around (GAA) technologies to achieve increased device density, greater power efficiency, and some increased performance over lateral devices. In a NSFET, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts used in nanosheet-based devices also enable greater management of leakage current and parasitic capacitance in the active regions, even as drive currents increase.

SUMMARY

Embodiments of the invention are directed to a method for forming a vertically stacked nanosheet CMOS semiconductor device. A non-limiting example of the method includes forming a first rare earth oxide layer on a substrate. A first nanosheet stack is formed on the rare earth oxide layer. The first nanosheet stack includes a first nanosheet. A second rare earth oxide layer is formed on the first nanosheet stack. A second nanosheet stack is formed on the second rare earth oxide layer. The second nanosheet stack includes a second nanosheet.

Embodiments of the invention are directed to a method for forming a vertically stacked nanosheet CMOS semiconductor device. A non-limiting example of the method includes forming a first rare earth oxide layer on a substrate. An n-FET nanosheet stack is formed on the rare earth oxide layer. The n-FET nanosheet stack includes vertically stacked silicon nanosheets. A second rare earth oxide layer is formed on the n-FET nanosheet stack. A p-FET nanosheet stack is formed on the second rare earth oxide layer. The p-FET nanosheet stack includes vertically stacked silicon nanosheets.

Embodiments of the invention are directed to a vertically stacked nanosheet CMOS semiconductor structure. A non-limiting example of the semiconductor device includes a first rare earth oxide layer on a substrate. The device further includes a first nanosheet stack on the rare earth oxide layer. The first nanosheet stack includes a first nanosheet. A second rare earth oxide layer is on the first nanosheet stack. The device further includes a second nanosheet stack on the second rare earth oxide layer. The second nanosheet stack includes a second nanosheet.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a top-down view of a semiconductor structure after a processing operation according to one or more embodiments of the invention;

FIGS. 1B and 1C depict cross-sectional views of the semiconductor structure shown in FIG. 1A taken along the lines X-X' and Y-Y', respectively, after a processing operation according to one or more embodiments of the invention;

FIG. 2A depicts a top-down view of a semiconductor structure after a processing operation according to one or more embodiments of the invention;

FIGS. 2B and 2C depict cross-sectional views of the semiconductor structure shown in FIG. 2A taken along the lines X-X' and Y-Y', respectively, after a processing operation according to one or more embodiments of the invention;

FIG. 3A depicts a top-down view of a semiconductor structure after a processing operation according to one or more embodiments of the invention;

FIG. 3B depicts a cross-sectional view of the semiconductor structure shown in FIG. 3A taken along the line X-X' after a processing operation according to one or more embodiments of the invention;

FIG. 4A depicts a top-down view of a semiconductor structure after a processing operation according to one or more embodiments of the invention;

FIG. 4B depicts a cross-sectional view of the semiconductor structure shown in FIG. 4A taken along the line X-X' after a processing operation according to one or more embodiments of the invention;

FIG. 6A depicts a top-down view of a semiconductor structure after a processing operation according to one or more embodiments of the invention;

FIG. 6B depicts a cross-sectional view of the semiconductor structure shown in FIG. 6A taken along the line X-X' after a processing operation according to one or more embodiments of the invention;

FIG. 7A depicts a top-down view of a semiconductor structure after a processing operation according to one or more embodiments of the invention;

FIGS. 7B and 7C depict cross-sectional views of the semiconductor structure shown in FIG. 7A taken along the lines X-X' and Y-Y', respectively, after a processing operation according to one or more embodiments of the invention;

FIG. 8A depicts a top-down view of a semiconductor structure after a processing operation according to one or more embodiments of the invention;

FIGS. 8B and 8C depict cross-sectional views of the semiconductor structure shown in FIG. 8A taken along the lines X-X' and Y-Y', respectively, after a processing operation according to one or more embodiments of the invention.

Figure 5B:
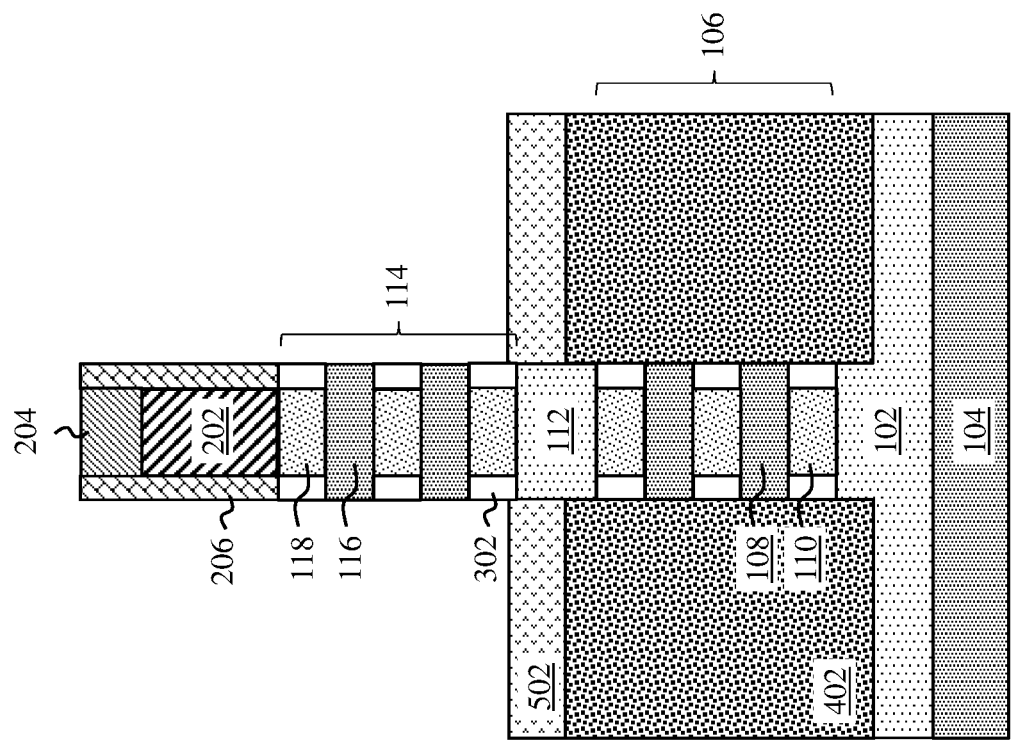
FIG. 5B depicts a cross-sectional view of the semiconductor structure shown in FIG. 5A taken along the line X-X' after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular vertically stacked nanosheet CMOS transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, a metal-oxide-semiconductor field-effect transistor (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by the oxide portion of the metal oxide gate electrode. The oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

There are challenges, however, in scaling some nanosheet architectures beyond the 10 nm node. One such challenge is the difficulty in fabricating high-density nanosheet-based CMOS structures. Conventional nanosheet-based CMOS structures contain both an n-FET and a p-FET arranged side by side over the substrate. Such as arrangement requires a relatively large device footprint.

Turning now to an overview of aspects of the present invention, one or more embodiments of the invention address the above-described shortcomings of the prior art by providing fabrication methods and resulting structures for vertically-stacked nanosheet-based CMOS transistors. The high density, vertically stacked nanotube CMOS architecture described herein saves device footprint area by stacking the p-FET and n-FET on top of each other. Epitaxially grown rare earth oxides (REOs) are leveraged within the nanosheet structure to insulate the nanosheet-based CMOS transistor from the substrate, thereby reducing source/drain leakage current. Epitaxially grown REOs are further leveraged in the nanosheet structure to ensure isolation between the stacked n-FET and p-FET nanosheets. The REO layer between the transistor and the substrate also improves the quality of the epitaxially grown bottom source/drain, as epitaxial growth can occur on the exposed surface of the REO layer in addition to the exposed sidewalls of the nanosheets. The REO isolation region between the stacked n-FET and p-FET nanosheets also serves as a buffer that prevents undesired oxide loss resulting from downstream integration processes.

Turning now to a more detailed description of aspects of the present invention, FIG. 1A depicts a top-down view of a semiconductor structure 100 during an intermediate operation of a method of fabricating a semiconductor device according to one or more embodiments of the invention. FIG. 1B depicts a cross-sectional view of the semiconductor structure shown in FIG. 1A taken along the line X-X' while FIG. 1C depicts a cross-sectional view of the semiconductor structure shown in FIG. 1A taken along the line Y-Y'.

As depicted in FIG. 1B, a partially fabricated semiconductor device can include a first rare earth oxide (REO) layer 102 formed over a substrate 104. The first REO layer 102 can be made of any suitable rare earth oxide material, such as, for example, yttrium oxide ($Y_2O_3$), lanthanum oxide ($La_2O_3$), cerium oxide ($CeO_2$), praseodymium oxide ($Pr_6O_{11}$), neodymium oxide ($Nd_2O_3$), samarium oxide ($Sm_2O_3$), europium oxide ($Eu_2O_3$), gadolinium oxide ($Gd_2O_3$), terbium oxide ($Tb_4O_7$), dysprosium oxide ($Dy_2O_3$), holmium oxide ($Ho_2O_3$), erbium oxide ($Er_2O_3$), ytterbium oxide ($Yb_2O_3$), lutetium oxide ($Lu_2O_3$), scandium oxide ($Sc_2O_3$), and thulium oxide ($Tm_2O_3$).

The first REO layer 102 can have a height ranging from 1 nm to 150 nm or more, for example, from 10 nm to 100 nm. In some embodiments, the first REO layer 102 is formed to a height of about 50 nm, although other thicknesses are within the contemplated scope of the invention. The first REO layer 102 can be formed by a variety of methods, such as, for example, ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), and molecular beam epitaxy (MBE). In some embodiments, the first REO layer 102 can be epitaxially grown from gaseous or liquid precursors. Epitaxial semiconductor materials can be grown using vapor-phase epitaxy (VPE), MBE, liquid-phase epitaxy (LPE), or other suitable processes.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on other exposed surfaces, such as silicon dioxide or silicon nitride surfaces.

The substrate 104 can be made of any suitable substrate material, such as, for example, monocrystalline Si, silicon germanium (SiGe), III-V compound semiconductor, II-VI compound semiconductor, or semiconductor-on-insulator (SOI). In some embodiments, the substrate 104 can be a silicon substrate. In some embodiments, the substrate 104 includes a buried oxide layer (not depicted). The buried oxide layer can be made of any suitable dielectric material, such as, for example, a silicon oxide. In some embodiments, the buried oxide layer is formed to a thickness of about 145 nm, although other thicknesses are within the contemplated scope of the invention. The semiconductor structure 100 can be electrically isolated from other regions of the substrate 104 by a shallow trench isolation region (not depicted).

In some embodiments, a first stack 106 of one or more semiconductor layers 108 alternating with one or more sacrificial layers 110 is formed over the first REO layer 102. The first stack 106 can be formed such that the topmost and bottommost layer of the first stack 106 is a sacrificial layer. While depicted as a stack having two semiconductor layers alternating with three sacrificial layers for ease of illustration, it is understood that the stack can include any number of semiconductor layers alternating with a corresponding number of sacrificial layers. For example, the first stack 106 can include three semiconductor layers alternating with four sacrificial layers.

Each of the semiconductor layers 108 can have a height ranging from 4 nm to 12 nm, for example, from 7 nm to 10 nm. In some embodiments, the semiconductor layers 108 have a height of about 9 nm. The semiconductor layers 108 can be made of any suitable semiconductor channel material, such as, for example, monocrystalline Si, III-V compound semiconductor, or II-VI compound semiconductor. In some embodiments, the semiconductor layers 108 are made of silicon.

Each of the sacrificial layers 110 can have a height ranging from 6 nm to 20 nm, for example, from 9 nm to 15 nm. In some embodiments, the sacrificial layers 110 have a height of about 12 nm. In some embodiments, the sacrificial layers 110 are made of SiGe. In some embodiments, the sacrificial layers 110 include a Ge concentration of 20 to 80 percent, for example 25 percent, although other Ge concentrations are within the contemplated scope of the invention.

The semiconductor layers 108 and the sacrificial layers 110 can be formed by a variety of methods, such as, for example, UHVCVD, RTCVD, MOCVD, LPCVD, LRP-CVD, and MBE. In some embodiments, the semiconductor layers 108 and the sacrificial layers 110 are epitaxially grown from gaseous or liquid precursors. Epitaxial semiconductor materials can be grown using VPE, MBE, LPE, or other suitable processes. Epitaxial silicon and SiGe can be doped during deposition (in-situ doped) by adding n-type dopants (e.g., phosphorus or arsenic) or p-type dopants (e.g., Ga, B, $BF_2$, or Al). The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions include silicon. In some embodiments, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

As illustrated in FIG. 1B, a second REO layer 112 can be formed over a topmost layer of the first stack 106. The second REO layer 112 can be made from a similar material and can be formed in a similar manner as the first REO layer 102. In some embodiments, the second REO layer 112 is epitaxially grown on a surface of the first stack 106. In some embodiments, the first REO layer 102 and the second REO layer 112 can be made of a same rare earth oxide. In some embodiments, the first REO layer 102 and the second REO layer 112 can be made of a different rare earth oxide. The second REO layer 112 can have a height ranging from 10 nm to 80 nm or more, for example, from 30 nm to 50 nm. In some embodiments, the second REO layer 112 is formed to a height of about 40 nm, although other thicknesses are within the contemplated scope of the invention.

In some embodiments, a second stack 114 of one or more semiconductor layers 116 alternating with one or more sacrificial layers 118 is formed over the second REO layer 112. The second stack 114 can be formed such that the topmost and bottommost layer of the second stack 114 is a sacrificial layer. While depicted as a stack having two semiconductor layers alternating with three sacrificial layers for ease of illustration, it is understood that the stack can include any number of semiconductor layers alternating with a corresponding number of sacrificial layers. For example, the second stack 114 can include three semiconductor layers alternating with four sacrificial layers.

Each of the semiconductor layers 116 can have a height ranging from 4 nm to 12 nm, for example, from 7 nm to 10 nm. In some embodiments, the semiconductor layers 116 have a height of about 9 nm. The semiconductor layers 116 can be made of any suitable semiconductor channel material, in a similar manner as the semiconductor layers 108. In some embodiments, the semiconductor layers 116 are made of silicon.

Each of the sacrificial layers 118 can have a height ranging from 6 nm to 20 nm, for example, from 9 nm to 15 nm. In some embodiments, the sacrificial layers 118 have a height of about 12 nm. In some embodiments, the sacrificial layers 118 are made of SiGe. In some embodiments, the sacrificial layers 118 include a Ge concentration of 20 to 80 percent, for example 25 percent, although other Ge concentrations are within the contemplated scope of the invention.

The semiconductor layers 116 and the sacrificial layers 118 can be formed in a similar manner as the semiconductor layers 108 and the sacrificial layers 110. In some embodiments, the semiconductor layers 116 and the sacrificial layers 110 are epitaxially grown from gaseous or liquid precursors. In some embodiments, the semiconductor layers 116 and/or the sacrificial layers 118 can be doped during deposition (in-situ doped) by adding n-type dopants (e.g., phosphorus or arsenic) or p-type dopants (e.g., Ga, B, $BF_2$, or Al). The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments, a hard mask 120 can be formed on a topmost surface of the second stack 114. In some embodiments, the hard mask 120 includes a nitride, such as silicon nitride. In some embodiments, the hard mask 120 is formed to a thickness of 40 nm, although other thicknesses are within the contemplated scope of the invention. In some embodiments, a second hard mask (not depicted) can be formed on the hard mask 120, to form a bilayer hard mask. In some embodiments, the second hard mask includes an oxide, such as, for example, silicon dioxide.

In some embodiments, portions of the hard mask 120 are removed (e.g., patterned) to expose one or more surfaces of the second stack 114. In some embodiments, the first stack 106, the second stack 114, and the second REO layer 112 are patterned selective to the hard mask 120. As illustrated in FIG. 2C, portions of the first stack 106, the second stack 114, and the second REO layer 112 that are not covered by the patterned hard mask 120 can be removed using a wet etch, a dry etch, or a combination of sequential wet and/or dry etches. In this manner, the first stack 106 and the second stack 114 can be patterned to expose one or more surfaces of the first REO layer 102. In some embodiments, the patterning process removes a portion of the first REO layer 102, exposing sidewalls of the first REO layer 102. In other words, the patterning process can result in a recessing of the first REO layer 102. In some embodiments, the first stack 106 and the second stack 114 are patterned into one or more fins having a width of about 10 nm to 50 nm, for example 25 nm, although other widths are within the contemplated scope of the invention. For ease of illustration, the first stack 106 and the second stack 114 are depicted as being patterned to form three fins. It is understood, however, that the first stack 106 and the second stack 114 can be patterned into any number of parallel fins.

FIG. 2A depicts a top-down view of the semiconductor structure 100 during an intermediate operation of a method of fabricating a semiconductor device according to one or more embodiments of the invention. FIGS. 2B and 2C depict cross-sectional views of the semiconductor structure shown in FIG. 2A taken along the lines X-X' and Y-Y', respectively.

FIGS. 2A, 2B, and 2C illustrate the formation of a sacrificial gate 202 (also known as a dummy gate) over a surface of the second stack 114 after removing the hard mask 120. The sacrificial gate 202 can be made of any suitable material, such as, for example, amorphous silicon or polysilicon. The sacrificial gate 202 can be formed using any known method for patterning a sacrificial gate, such as, for example, a polysilicon fill and a wet etch, a dry etch, or a combination of sequential wet and/or dry etches. In some embodiments, a hard mask 204 (also known as a gate hard mask) is formed on the sacrificial gate 202. The hard mask 204 can be made of any suitable material, such as, for example, a silicon nitride. In some embodiments, a second hard mask (not depicted) is formed on the hard mask 204, to form a bilayer hard mask. The second hard mask can include an oxide, such as, for example, a silicon oxide. In some embodiments, the sacrificial gate 202 is formed by patterning the hard mask 204 and removing uncovered portions of the sacrificial gate 202 with a reactive ion etch (RIE).

In some embodiments, spacers 206 (also known as sidewall spacers or gate spacers) are formed on sidewalls of the sacrificial gate 202. In some embodiments, the spacers 206 are formed using a CVD, PECVD, ALD, PVD, chemical solution deposition, or other like processes in combination with a wet or dry etch process. For example, spacer material can be conformally deposited over the semiconductor structure 100 and selectively removed using a RIE to form the spacers 206. The spacers 206 can be made of any suitable material, such as, for example, a low-k dielectric, a nitride, silicon nitride, silicon oxide, SiON, SiC, SiOCN, or SiBCN. The spacers 206 can be formed to a thickness of about 5 to 10 nm, although other thicknesses are within the contemplated scope of the invention.

FIG. 3A depicts a top-down view of the semiconductor structure 100 during an intermediate operation of a method of fabricating a semiconductor device according to one or more embodiments of the invention. FIG. 3B depicts a cross-sectional view of the semiconductor structure shown in FIG. 3A taken along the line X-X'.

As illustrated in FIG. 3B, portions of the first stack 106, the second stack 114, and the second REO layer 112 can be removed to expose a surface of the first REO layer 102. In some embodiments, portions of the first stack 106, the second stack 114, and the second REO layer 112 are removed using an anisotropic etch such as reactive ion etch (RIE) process. After the first stack 106 and the second stack 114 are patterned, the remaining portions of the semiconductor layers 108 and 116 define one or more stacked nanosheets. In some embodiments, the first stack 106 and the second stack 114 are patterned to form nanosheets having a width of about 12 nm to 50 nm, for example 20 nm, although other widths are within the contemplated scope of the invention. In some embodiments, the patterning process removes a portion of the first REO layer 102, exposing sidewalls of the first REO layer 102. In other words, the patterning process can result in a recessing of the first REO layer 102. In this manner, the first stack 106 and the second stack 114 can be patterned to form source and drain recesses.

In some embodiments, sidewalls of the sacrificial layers 110 and 118 can be recessed selective to the semiconductor layers 108 and 116 to form one or more recesses. As discussed previously herein, the sacrificial layers 110 and 118 can be SiGe layers, while the semiconductor layers 108 and 116 can be Si layers. Accordingly, in some embodiments, portions of the sacrificial layers 110 and 118 can be removed using a SiGe etch selective to silicon. An example SiGe etch process selective to silicon is a selective HCl gas etch.

In some embodiments, an inner spacer 302 is deposited or otherwise formed in each recess. In some embodiments, the inner spacers 302 are formed by a conformal deposition (e.g., CVD or ALD) to plug the recesses followed by an etch back process to remove any excessive material. The inner spacers 302 can be made of any suitable material, such as, for example, a low-k dielectric, a nitride, silicon nitride, silicon oxide, SiON, SiC, SiOCN, or SiBCN.

FIG. 4A depicts a top-down view of the semiconductor structure 100 during an intermediate operation of a method of fabricating a semiconductor device according to one or more embodiments of the invention. FIG. 4B depicts a cross-sectional view of the semiconductor structure shown in FIG. 4A taken along the line X-X'.

FIGS. 4A and 4B illustrate the formation of source/drain regions 402 over the recessed surface of the first REO layer 102. The source/drain regions 402 can be formed on opposite ends of the first stack 106. The source/drain regions 402 can be epitaxially formed by a variety of methods, such as, for example, in-situ doped epitaxy, doped following the epitaxy, or by implantation and plasma doping. In some embodiments, epitaxial regions are epitaxially grown over the first REO layer 102. The source/drain regions 402 can be epitaxial semiconductor materials grown from gaseous or liquid precursors, as described previously herein. The source/drain regions 402 can be doped with n-type dopants (e.g., phosphorus or arsenic) or p-type dopants (e.g., boron or gallium). The dopant concentration in the source/drain regions 402 can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$. In some embodiments, the source/drain regions 402 are Si:P (phosphorus doped silicon) regions.

Advantageously, in some embodiments, the source/drain regions 402 can be epitaxially grown on the first REO layer 102 as well as on all exposed surfaces of the second REO layer 112 and the semiconductor layers 108 and 116. This improves the quality of the epitaxy over conventional source/drain regions, which are typically limited to epitaxial growth from the exposed ends of the nanosheets.

Figure 5A:
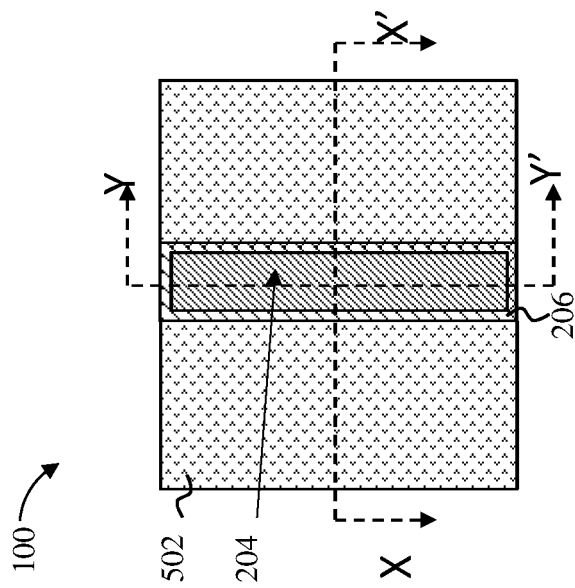
FIG. 5A depicts a top-down view of a semiconductor structure after a processing operation according to one or more embodiments of the invention.

FIG. 5A depicts a top-down view of the semiconductor structure 100 during an intermediate operation of a method of fabricating a semiconductor device according to one or more embodiments of the invention. FIG. 5B depicts a cross-sectional view of the semiconductor structure shown in FIG. 5A taken along the line X-X'.

As illustrated in FIG. 5B, a surface of the source/drain regions 402 can be recessed below a top surface of the second REO layer 112. In other words, the source/drain regions 402 can be recessed to expose a sidewall of the second REO layer 112. In this manner, the source/drain regions 402 is confined to the region of the first stack 106. As will be explained in further detail herein, a second source/drain region having an opposite doping type can be formed over the source/drain regions 402. For example, if the source/drain regions 402 are p-type, the second source/drain region can be n-type, and if the source/drain regions 402 are n-type, the second source/drain region can be p-type.

The second REO layer 112 can have a thickness which is greater than a thickness of the semiconductor layers 108 and 116. For example, the second REO layer 112 can have a thickness of 20 nm to 50 nm, while the semiconductor layers 108 and 116 can have a thickness of 6 nm to 10 nm. Accordingly, the process margin for ensuring that the source/drain regions 402 can be recessed below a top surface of the second REO layer 112, without over-recessing below the second REO layer 112, can be relatively relaxed.

In some embodiments, a buffer layer 502 is formed over the recessed surface of the source/drain regions 402. In some embodiments, the buffer layer 502 can include an oxide, such as, for example, silicon dioxide. In some embodiments, the buffer layer 502 can be formed using a known oxide deposition process followed by an oxide recess. In some embodiments, the buffer layer 502 can be recessed such that a sidewall of the bottommost nanosheet in the stack 114 is exposed.

FIG. 6A depicts a top-down view of the semiconductor structure 100 during an intermediate operation of a method of fabricating a semiconductor device according to one or more embodiments of the invention. FIG. 6B depicts a cross-sectional view of the semiconductor structure shown in FIG. 6A taken along the line X-X'.

FIGS. 6A and 6B illustrate the formation of source/drain regions 602 over the surface of the buffer layer 502. The source/drain regions 602 can be formed on opposite ends of the second stack 114. The source/drain regions 602 can be epitaxially formed by a variety of methods, such as, for example, in-situ doped epitaxy, doped following the epitaxy, or by implantation and plasma doping. In some embodiments, epitaxial regions are epitaxially grown from the exposed sidewalls of the semiconductor layers 116. The source/drain regions 602 can be epitaxial semiconductor materials grown from gaseous or liquid precursors, as described previously herein. The source/drain regions 602 can be doped with n-type dopants (e.g., phosphorus or arsenic) or p-type dopants (e.g., boron or gallium). The dopant concentration in the source/drain regions 402 can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$. In some embodiments, the source/drain regions 602 are SiGe:B (boron doped silicon germanium) regions.

In some embodiments, the source/drain regions 602 can be doped to have an opposite doping type from the source/drain regions 402. For example, if the source/drain regions 402 are p-type, the source/drain regions 602 can be n-type, and if the source/drain regions 402 are n-type, the source/drain regions 602 can be p-type. In this manner, the first stack 106 can correspond to n-FET or p-FET nanosheets, while the second stack 114 can correspond to nanosheets of the opposite type. For example, the first stack 106 can include n-FET nanosheets, while the second stack 114 can include p-FET nanosheets. Notably, the n-FET and p-FET nanosheets constructed in this manner are vertically stacked, reducing device footprint requirements.

In some embodiments, an interlayer dielectric 604 is formed over the source/drain regions 602. The interlayer dielectric 604 can be made of any suitable dielectric material, such as, for example, porous silicates, carbon doped oxides, silicon dioxides, silicon nitrides, silicon oxynitrides, or other dielectric materials. Any known manner of forming the interlayer dielectric 604 can be utilized, such as, for example, CVD, PECVD, ALD, flowable CVD, spin-on dielectrics, or PVD. In some embodiments, the interlayer dielectric 604 is planarized to a top surface of the spacers 206 and/or the hard mask 204, using, for example, a CMP process.

FIG. 7A depicts a top-down view of the semiconductor structure 100 during an intermediate operation of a method of fabricating a semiconductor device according to one or more embodiments of the invention. FIGS. 7B and 7C depict cross-sectional views of the semiconductor structure shown in FIG. 7A taken along the lines X-X' and Y-Y', respectively.

FIGS. 7A, 7B, and 7C illustrate the removal of the sacrificial gate 202. In some embodiments, the hard mask 204 is removed to expose a surface of the sacrificial gate 202. The hard mask 204 can be removed using any suitable hard mask open process, such as a wet etch or a dry etch. Following the removal of the hard mask 204, the sacrificial gate 202 is removed to expose a surface of the first REO layer 102, as well as sidewalls of the first stack 106 and the second stack 114.

Once exposed, the sacrificial layers 110 and 118 can be removed to release the nanosheets (e.g., the semiconductor layers 108 and 116). In some embodiments, the sacrificial layers 110 and 118 can be removed selective to the semiconductor layers 108 and 116. For example, sacrificial layers made of SiGe can be removed selective to semiconductor layers made of silicon. The sacrificial layers 110 and 118 can be removed selective to the semiconductor layers 108 and 116 using any suitable process known for etching SiGe selective to silicon. In some embodiments, the semiconductor layers 108 are removed using a wet etch, a dry etch, or a combination of sequential wet and/or dry etches. An example of an etchant that can enable this process is HCl gas.

FIG. 8A depicts a top-down view of the semiconductor structure 100 during an intermediate operation of a method of fabricating a semiconductor device according to one or more embodiments of the invention. FIGS. 8B and 8C depict cross-sectional views of the semiconductor structure shown in FIG. 8A taken along the lines X-X' and Y-Y', respectively.

FIGS. 8A, 8B, and 8C illustrate the replacement of the sacrificial gate 202 with a conductive gate 802 (sometimes referred to as a metal gate). The gate 802 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

In some embodiments, the gate 802 is a high-k metal gate (HKMG) and a high-k dielectric film 804 is formed between the gate 802 and the nanosheets (e.g., the semiconductor layers 108 and 116). In some embodiments, the high-k dielectric film 804 can be used to modify the work function of the gate 802. The high-k dielectric film 804 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric film 804 can have a thickness of about 0.5 nm to about 4 nm. In some embodiments, the high-k dielectric film 804 has a thickness of about 2 nm, although other thicknesses are within the contemplated scope of the invention.

In some embodiments, work function layers (not depicted) are formed between the high-k dielectric film 804 and the conductive gate 802. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to further modify the work function of the gate 802. The work function layers can be formed to a thickness of about 2 to 10 nm, although other thicknesses are within the contemplated scope of the invention.

Metal contacts (not depicted) can be formed on top of the gate 802 and through the interlayer dielectric 604 to contact the source/drain regions 402 and 602 using known metallization techniques. The contacts can be of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

Figure 9:
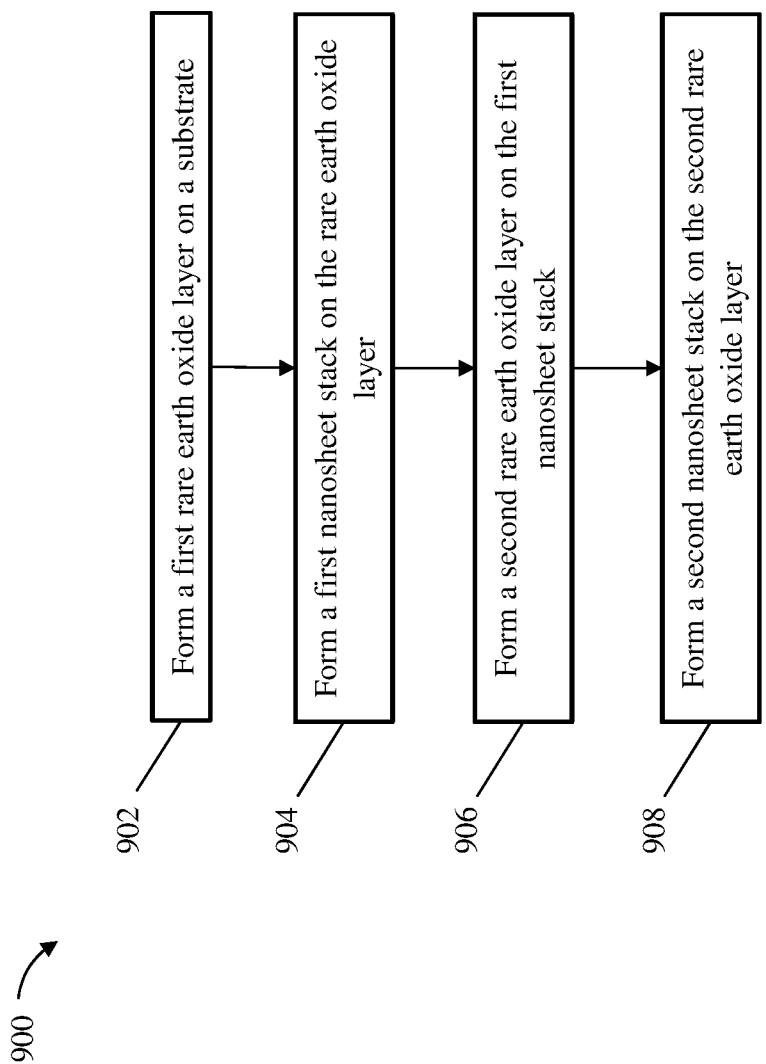
FIG. 9 depicts a flow diagram illustrating a method according to one or more embodiments of the invention.

FIG. 9 depicts a flow diagram 900 illustrating a method for forming a semiconductor device according to one or more embodiments of the invention. As shown at block 902, a first rare earth layer is formed over a substrate. At 904, a first nanosheet stack is formed on the rare earth oxide layer. The first nanosheet stack includes a first nanosheet.

As shown at block 906, a second rare earth oxide layer is formed on the first nanosheet stack. At block 908, a second nanosheet stack is formed on the second rare earth oxide layer. The second nanosheet stack includes a second nanosheet. In some embodiments, the first nanosheet stack defines an n-FET region and the second nanosheet stack defines a p-FET region. In this manner, a vertically stacked nanosheet-based CMOS transistor architecture is provided. As discussed previously herein, vertically stacking the n-FET and p-FET reduces the device footprint requirement.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a first rare earth oxide layer on a substrate;
    forming a first nanosheet stack on the rare earth oxide layer, the first nanosheet stack comprising a first nanosheet;
    forming a second rare earth oxide layer on the first nanosheet stack; and
    forming a second nanosheet stack on the second rare earth oxide layer, the second nanosheet stack comprising a second nanosheet.

2. The method of claim 1 further comprising forming a first source and a first drain on the first rare earth oxide layer such that the first source is adjacent to a first sidewall of the first nanosheet and the first drain is adjacent to a second sidewall of the first nanosheet, the first and second sidewalls on opposite ends of the first nanosheet.

3. The method of claim 2 further comprising forming a dielectric layer on the first source and first drain.

4. The method of claim 3 further comprising forming a second source and a second drain on the dielectric layer such that the second source is adjacent to a first sidewall of the second nanosheet and the second drain is adjacent to a second sidewall of the second nanosheet, the first and second sidewalls on opposite ends of the second nanosheet.

5. The method of claim 4 further comprising:
doping the first source and the first drain with a first dopant; and
doping the second source and the second drain with a second dopant.

6. The method of claim 5, wherein the first dopant is an n-type dopant and the second dopant is a p-type dopant.

7. The method of claim 5, wherein the first dopant is a p-type dopant and the second dopant is an n-type dopant.

8. The method of claim 4, wherein:
the first source and the first drain comprise phosphorus doped silicon; and
the second source and the second drain comprise boron doped silicon germanium.

9. The method of claim 2 further comprising epitaxially growing the first source and the first drain on exposed surfaces of the first rare earth oxide layer and on exposed surfaces of the first nanosheet.

10. The method of claim 1, wherein a thickness of the second rare earth oxide layer is greater than a thickness of the first nanosheet.

11. The method of claim 1, wherein the first nanosheet stack further comprises a third nanosheet vertically stacked over the first nanosheet and the second nanosheet stack further comprises a fourth nanosheet vertically stacked over the second nanosheet.

12. A method for forming a semiconductor device, the method comprising:
forming a first rare earth oxide layer on a substrate;
forming an n-FET nanosheet stack on the rare earth oxide layer, the n-FET nanosheet stack comprising vertically stacked silicon nanosheets;
forming a second rare earth oxide layer on the n-FET nanosheet stack; and
forming a p-FET nanosheet stack on the second rare earth oxide layer, the p-FET nanosheet stack comprising vertically stacked silicon nanosheets.

13. The method of claim 12 further comprising forming a first source and a first drain on the first rare earth oxide layer such that the first source is adjacent to a first sidewall of the n-FET nanosheet stack and the first drain is adjacent to a second sidewall of the n-FET nanosheet stack, the first and second sidewalls on opposite ends of the n-FET nanosheet stack.

14. The method of claim 13 further comprising forming a dielectric layer on the first source and first drain.

15. The method of claim 14 further comprising forming a second source and a second drain on the dielectric layer such that the second source is adjacent to a first sidewall of the p-FET nanosheet stack and the second drain is adjacent to a second sidewall of the p-FET nanosheet stack, the first and second sidewalls on opposite ends of the p-FET nanosheet stack.

* * * * *